United States Patent [19]

Sasano

[11] Patent Number: 5,615,821
[45] Date of Patent: Apr. 1, 1997

[54] WIRE BONDING METHOD AND APPARATUS

[75] Inventor: Toshiaki Sasano, Sagamihara, Japan

[73] Assignee: Kabushiki Kaisha Shinkawa, Tokyo, Japan

[21] Appl. No.: 429,708

[22] Filed: Apr. 27, 1995

[30] Foreign Application Priority Data

Apr. 27, 1994 [JP] Japan .................................. 6-110241

[51] Int. Cl.⁶ ............................................. H01L 21/60
[52] U.S. Cl. ........................................ 228/102; 228/180.5
[58] Field of Search .................................. 228/7, 9, 102, 228/4.5, 180.5

[56] References Cited

U.S. PATENT DOCUMENTS 5,474,224  12/1995  Nishimaki et al. ..................... 228/102

FOREIGN PATENT DOCUMENTS

| 51-78174 | 7/1976 | Japan | H01L 21/60 |
| 57-50059 | 10/1982 | Japan | H01L 21/60 |
| 78239 | 3/1990 | Japan | 228/102 |
| 4-320350 | 11/1992 | Japan | H01L 21/60 |
| 4-31742 | 11/1992 | Japan | H01L 21/60 |

Primary Examiner—Kenneth J. Ramsey
Attorney, Agent, or Firm—Koda and Androlia

[57] ABSTRACT

A wire bonding method and apparatus for manufacturing semiconductor devices automatically correcting, after predetermined times of bonding executions, any shifts occurring via heat, etc. in an offset distance set between a capillary through which a bonding wire passes and a camera that takes images of leads of a lead frame and pads of a semiconductor chip.

3 Claims, 3 Drawing Sheets

WIRE BONDING METHOD AND APPARATUS

BACKGROUND OF THE INVENTION

1. Field of the Invention

The present invention relates to a wire bonding method and apparatus and more particularly to a wire bonding method and apparatus that includes a means for correcting the positional offset between a workpiece imaging camera and a capillary.

2. Prior Art

As shown in FIG. 4, in a workpiece 3 which comprises a semiconductor chip 2 installed on a lead frame 1, wires 4 are used for connecting the pads $P_1$, $P_2$ ... of a semiconductor chip 2 and the leads $L_1$, $L_2$ ... of a lead frame 1. The connection between the pads and the leads are done by a wire bonding apparatus as shown, for example, in FIG. 5.

Generally, in wire bonding between the pads and leads, any positional shift or discrepancy between them from predetermined positions is first detected at at least two points on the semiconductor chip 2 and at least two points on the lead frame 1 by a camera 11, and the bonding coordinates for the pads and leads stored beforehand in the bonding apparatus are corrected based upon the detected result.

When the detection of the positional shift is performed by the camera 11, an X-axis motor 12 and Y-axis motor 13 are first driven so that the central axis 11a of the camera 11 is moved directly above each measuring point. After the bonding coordinates are corrected as described above, the capillary 15, through which a bonding wire 4 passes, is moved in the X and Y directions, or horizontally, and in the Z direction, or vertically, and then the wire 4 is bonded between the pads $P_1$, $P_2$ ... of the semiconductor chip 2 and the leads $L_1$, $L_2$ ... of the lead frame 1.

In the process described above, the central axis 11a of the camera 11 and the central axis 15a of the capillary 15 are positionally offset by a distance W. Accordingly, after the positional shifts of points to be bonded have been detected by the camera 11 and the bonding coordinates have been corrected, an XY table or bonding table 16 that has the capillary 15 is moved horizontally the offset distance W by the X-axis motor 12 and Y-axis motor 13, thus bringing the capillary 15 above a first bonding point. Then, the wire 4 is bonded at the points of corrected bonding coordinates by moving the XY table in the X, Y and Z directions by the X-, Y- and Z-axis motors by raising and lowering the capillary arm 17 (or causing the capillary arm 17 to pivot).

In FIG. 5, the capillary arm 17 is pivotally mounted to a bonding head 10a, and the camera 11 is fixed to the bonding head 10a via a camera-holding arm. In this Figure, Xw represents the X-axis component of the offset distance W, and Yw represents the Y-axis component of the offset distance W. The devices disclosed in Japanese Patent Application Laid-Open (Kokai) Nos. 4-317342 and 4-320350 are examples of wire bonding apparatuses of the type described above. The methods disclosed in Japanese Patent Application Laid-Open (Kokai) No. 51-78174 and Japanese Patent Application Publication (Kokoku) No. 57-50059 are examples of methods for correcting the positions of workpieces.

As seen from the above, there is a mechanically determined fixed offset distance W between the central axis 11a of the camera 11 and the central axis 15a of the capillary 15.

Accordingly, bonding can only be accurately performed at bonding points by detecting via the camera 11 the amount of positional shift of each workpiece 3, correcting the bonding coordinates, and then moving the capillary 15 (in accordance with a predetermined program) a distance that corresponds to the offset distance so that the capillary 15 is at the corrected bonding coordinates.

However, a wire bonding apparatus includes a heating block for heating lead frames, and it also includes a capillary arm which holds the capillary. In addition to the heating block, other heat-generating sources such as X- and Y-axis motors and an ultrasonic oscillation source which is installed inside the capillary arm are used in a wire bonding apparatus. A Z-axis motor which raises and lowers or pivots a capillary arm is another element used in the bonding apparatus.

Due to the operating heat and variations in the ambient temperature caused by the heat-generating sources, differences are created between the thermal expansion of the capillary arm and the thermal expansion of the camera-holding arm that holds the camera. As a result, the offset distance between the central axis of the camera and the central axis of the capillary tends to change in terms of both amount and direction, and error caused by this fluctuation results in a shift in the bonding position.

Presently, the correction of such fluctuations in the offset is performed manually by the operator on a periodic basis.

Such correction is done, for instance, in the following manner:

(1) After bonding has been performed between the pad $P_1$ of the semiconductor chip 2 and the lead $L_1$ of the lead frame 1 as seen in FIG. 4, the XY table 16 shown in FIG. 5 is moved by an amount that is equal to the offset distance W which is added to the coordinates for the pad $P_1$, so that the central axis 11a of the camera 11 is moved to the position above the pad $P_1$;

(2) A check is made to see if a ball bonded to the pad $P_1$ that is imaged by the camera 11 is shifted with respect to the cross-hairs located at the center of a monitor screen;

(3) The XY table 16 is driven manually by operating a ten-key or chessman, so that a ball formed by the bonded wire is aligned with the cross-hairs at the center of the monitor screen; and (4) Correction is done by adding the amount of movement of the XY table 16 required in this alignment operation to the preset offset distance W.

The offset correction as described above involves manual operation which needs the bonding apparatus to be temporarily stopped, and then the ball is aligned with the cross-hairs at the center of the monitor screen by operating a manual input means such as a ten-key. Thus, considerable time is required. Furthermore, correction errors are likely to occur as a result of mistakes made by the operator, differences between individual operators, and by other factors. Moreover, in the manual correction, the resolution of the object image is determined by the resolution of the television monitor; and this results in that finer bonding positions cannot be judged, since the positional precision is in pixel (picture element) units. In addition, correction of fluctuations occurring over time is extremely difficult.

SUMMARY OF THE INVENTION

Accordingly, the object of the present invention is to provide a wire bonding method and apparatus in which positional shifts or discrepancies in the offset between the camera and capillary can be corrected automatically, the precision of the correction is high, and fluctuations that gradually occur in the offset distance can be automatically corrected.

The object of the present invention is accomplished by unique steps taken in a wire bonding method which uses a capillary that executes bonding on workpieces each consisting of a semiconductor chip bonded to a lead frame, a camera that includes a central optical axis for workpiece detection and is installed with a fixed offset distance from the capillary, and an XY table that moves the capillary and the camera together in X and Y directions, so that bonding is performed by detecting the amount of shift of the workpiece via the camera, correcting the bonding coordinates, and then moving the capillary by the amount which corresponds to the offset amount so that the capillary is positioned at the corrected bonding coordinates via a predetermined program and then bonding is executed, and the unique steps of the present invention in such a bonding method are that after the wire bonding has been performed, the XY table is automatically moved so that the central axis of workpiece detection of the camera is positioned above a bonded ball or capillary pressure mark formed during the bonding, and then the positional shift of the ball or capillary pressure mark is detected, thus correcting the shift in the offset accordingly.

In addition, the above-described object is accomplished by a unique structure for a wire bonding apparatus that includes a capillary performing wire bonding on workpieces each consisting of a semiconductor chip installed on a lead frame, a camera having a central optical axis for workpiece detection and being installed with a fixed offset distance from the capillary, an XY table for moving the capillary and camera together in X and Y directions, and an image controller for processing images obtained by the camera and calculating the positional shift of the images, and the unique structure provided by the present invention is that the wire bonding apparatus further includes:

- an offset-correction control memory which stores offset correction time and steps that move the central axis of workpiece detection of the camera to a position above a bonded ball or capillary pressure mark after bonding has been executed,
- an offset memory which stores the offset distance, and
- an operation controller which drives the XY table via the information stored in the offset-correction control memory so that the central axis of workpiece detection of the camera is moved to a position above the ball or capillary pressure mark and then corrects the offset amount stored in the offset memory in accordance with the amount of shift calculated by the image controller.

With the method and apparatus as described above, when a predetermined time that has been set in the offset-correction control memory is reached after wire bonding is successively performed on workpieces, the operation controller moves the central axis of workpiece detection of the camera to a position above the bonded ball or the capillary pressure mark in accordance with the offset-correction control memory, and the ball or capillary pressure mark is imaged by the camera. This image is image-processed by the image controller, thus obtaining the amount of shift. Then, the operation controller corrects the offset amount stored in the offset memory based upon the thus obtained amount of shift.

Afterward, the offset amount stored in the offset memory is used until the next offset correction is performed.

DETAILED DESCRIPTION OF THE INVENTION

One embodiment of the present invention will be described with reference to FIGS. 1, 2, 4 and 5.

Figure 1:
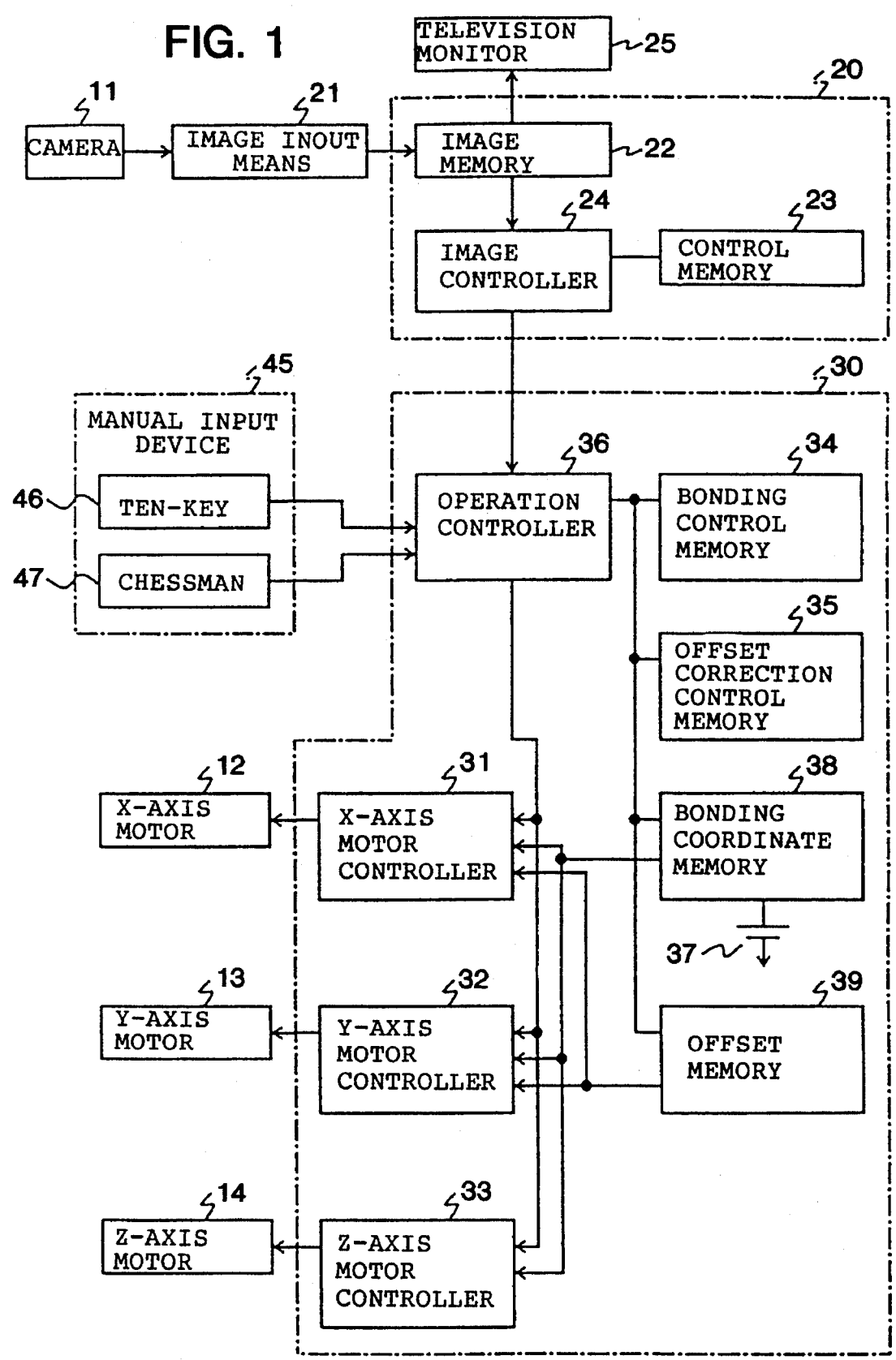
FIG. 1 is a block diagram which illustrates one embodiment of the control circuit used in the wire bonding method and apparatus of the present invention.
Figure 5:
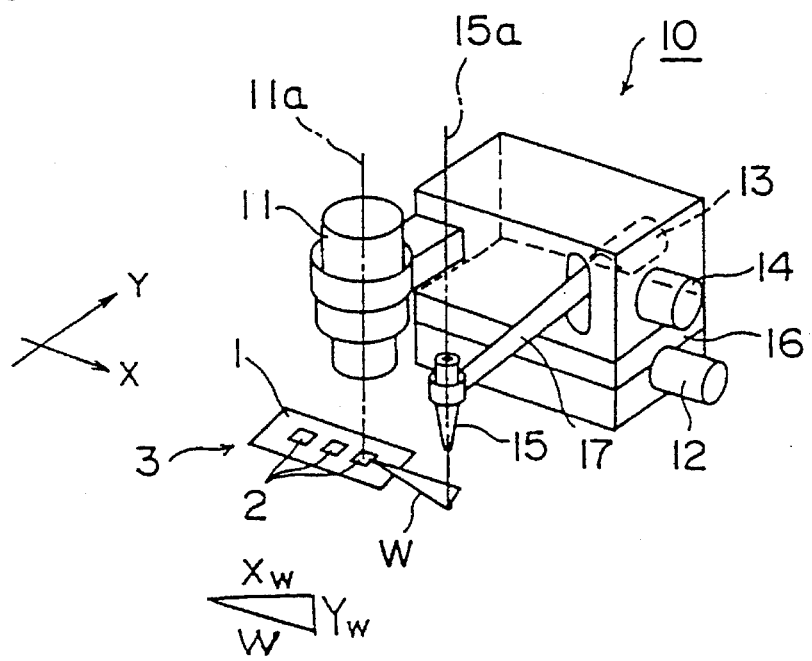
FIG. 5 is a perspective view which illustrates one example of a wire bonding apparatus.

As shown in FIG. 1, the control circuit of the bonding apparatus includes an image processor 20 which processes the images obtained by a camera 11, an operation driver 30 which operates the wire bonding apparatus 10 shown in FIG. 5, and a manual input device 45 which allows manual input of data such as coordinates, etc. into the operation driver 30.

The image processor 20 includes an image memory 22 which stores video images inputted from the camera 11 via an image input device 21, a control memory 23 in which image processing procedures for the image memory 22 are stored, and an image controller 24. The image controller 24 is connected to the image memory 22 and to the control memory 23 and processes images sent from the image memory 22 based upon the procedures stored in the control memory 23 and calculates the amount of shift from the center of each image.

The images stored in the image memory 22 are displayed on a television monitor 25.

The operation driver 30 includes an operation controller 36 in addition to an X-axis motor controller 31, Y-axis motor controller 32 and Z-axis motor controller 33 which are connected to the operation controller 36 to be respectively controlled thereby to move the capillary arm 17 horizontally and vertically.

The operation driver 30 further includes a bonding control memory 34 which is connected to the operation controller 36 and stores control procedures that control the motors 12, 13 and 14 for executing bonding operations as well as procedures for calculating bonding coordinates.

An offset-correction control memory 35, which stores correction times and procedures for the offset distance W and is connected to the operation controller 36, is further installed in the operation driver 30.

The operation controller 36 not only controls the X-axis motor controller 31, Y-axis motor controller 32, Z-axis motor controller 33, bonding control memory 34 and offset-correction control memory 35 but also calculates actual bonding coordinates and offset correction amounts based on the center shift amounts that are calculated by the image controller 24 and also based on the bonding coordinate data inputted via the manual input device 45.

The operation driver 30 further includes a bonding coordinate memory 38 and an offset memory 39, both connected to the operation controller 36. The bonding coordinate memory 38 is backed-up by a battery 37 and stores the bonding coordinates calculated by the operation controller 36, and the offset memory 39 stores the corrected offset amount.

The manual input device 45 connected to the operation controller 36 can be a ten-key 46 or a chessman 47. The bonding coordinates and offset amounts are inputted into the operation driver 30 via either one of these devices.

The bonding system described above operates in the following manner:

Time data is inputted beforehand into the offset-correction control memory 35 using the manual input device 45 so that offset correction is performed at predetermined intervals. In addition, the coordinates for an arbitrary pad, for example, the pad $P_1$, which is used for offset correction, is also inputted beforehand in the memory 35. Then, as described above regarding the prior art, wire bonding is performed on a workpieces 3 shown in FIG. 4 using the wire bonding apparatus 10 shown in FIG. 5. During the bonding, a ball of the bonding wire is formed on the pads (and leads), or a mark by the pressure of the lower end of the capillary is made on the pads (and leads).

Wire bonding is successively performed on workpieces 3. When a certain time which has been set in the offset-correction control memory 35 is reached, the coordinates of the pad stored in the bonding coordinate memory 38 and the offset distance W stored in the offset memory 39 are read out by the operation controller 36 in accordance with the information stored in the offset-correction control memory 35 right after the wire bonding on the workpiece 3 at the reached time has been completed.

Then, the operation controller 36 activates the X-axis motor controller 31 and Y-axis motor controller 32 so that the controllers are set so as to match the coordinates obtained by adding the offset distance W to the coordinates of the pad As a result, the X-axis motor 12 and Y-axis motor 13 are actuated, and the central axis 11a of the camera 11 is moved to the position above the bonded pad $P_1$.

After this, the pad $P_1$ is imaged by the camera 11. This image is converted into a digital signal by the image input device 21 and stored in the image memory 22. The image stored in the image memory 22 is image-processed by the image controller 24, and the amount of center shift of the ball formed on the wire which has been bonded to the pad $P_1$ is calculated.

Figure 2:
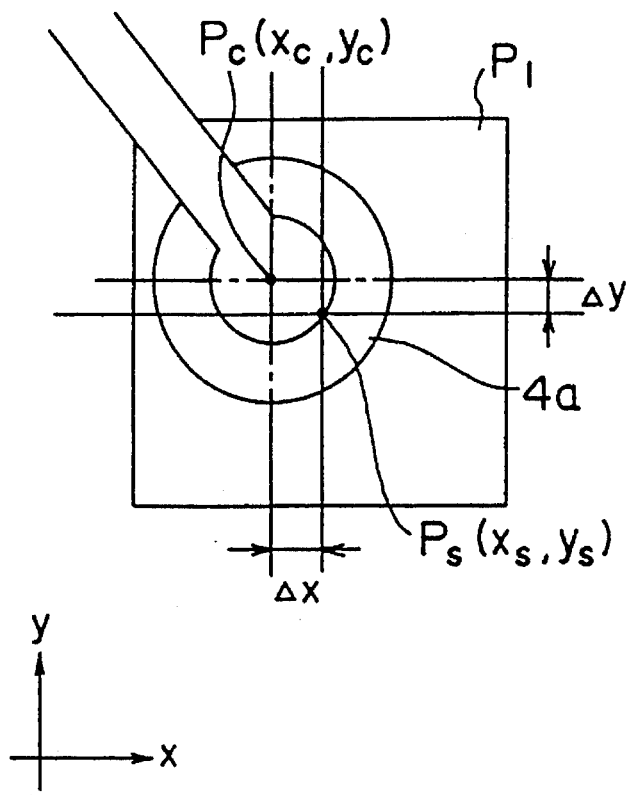
FIG. 2 is a diagram which illustrates the detection of shifts in the position of the bonded ball.
Figure 3:
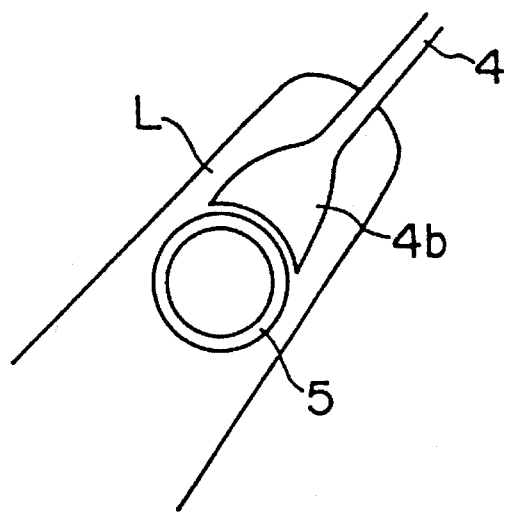
FIG. 3 is a top view of the bonding area of a lead.
Figure 4:
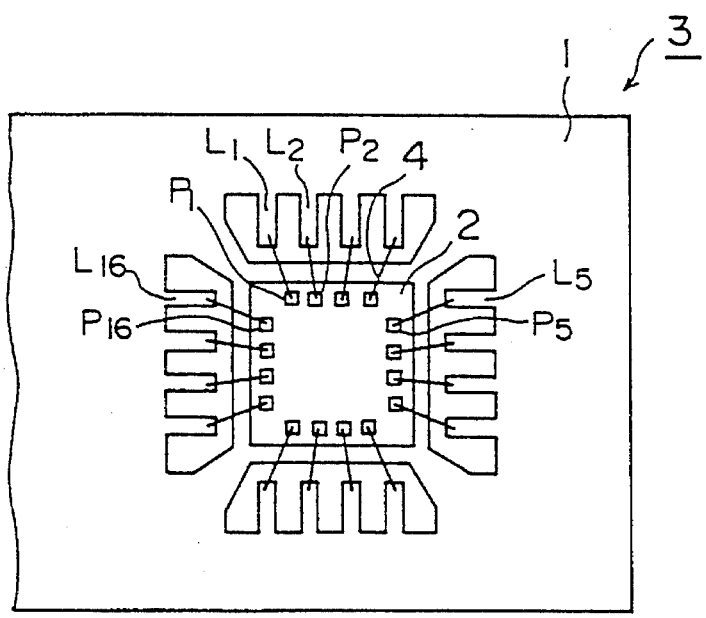
FIG. 4 is a top view which illustrates one example of a workpiece.

FIG. 2 shows an example of the image of the ball 4a formed on the pad $P_1$ displayed on the television monitor 25. The offset correction is made based upon the pad $P_1$.

The center of the ball 4a is referred to by the coordinates Pc (xc, yc) and the center of the camera by the coordinates Ps (xs, ys); thus, the amount of shift $\Delta x$ and $\Delta y$ of the center Pc of the ball 4a from the center Ps of the camera image are obtained by Equation 1 below. Since the original positional relationship between the center of the camera and the bonding center is offset, $\Delta x$ and $\Delta y$ are the amounts of shift in the offset at that point in time.

Equation 1

$$\Delta x = xs - xc$$

$$\Delta y = ys - yc$$

These calculated shift amounts $\Delta x$ and $\Delta y$ can be detected with sub-pixel precision. In regard to sub-pixel calculations, it is known that points having a maximum correlation amount can be found with sub-pixel precision by using HILL-CLIMB and interpolation techniques, etc. in addition to a multi-amount (graded image) correlation treatment.

Furthermore, these shift amounts $\Delta x$ and $\Delta y$ are determined as numbers of pixels in the image memory 22. However, the actual dimensions per pixel (amounts of movement of the XY table 16) depend on the magnification ratio of the camera 11 and are therefore peculiar to the apparatus used. Accordingly, these amounts can be converted into amounts of movement of the XY table. If the constants used for this conversion are kx and ky, the actual dimensional shifts $dx_1$ and $dy_1$ are calculated using Equation 2.

Equation 2

$$dx = kx \cdot \Delta x$$

$$dy = ky \cdot \Delta y$$

Next, the operation controller 36 performs a correction by adding (as shown in Equation 3) the offset $\Delta x$ and $\Delta y$ to the X-axis component Xw and Y-axis component Yw of the offset amount W stored in the offset memory 39 and causes these new offset components $Xw_1$ and $Yw_1$ to be stored in the offset memory 39. Subsequently, the offset components $Xw_1$ and $Yw_1$ are used until the next offset correction is performed.

Equation 3

$$Xw_1 = Xw + dx$$

$$Yw_1 = Yw + dy$$

In the above, the offset correction is performed periodically at prescribed times. However, the present invention is not limited to this.

A large temperature change that results in a large fluctuation in the offset can be predicted to occur when the power supply to the bonding apparatus is switched on or when the heating block is switched on, etc. In these cases, accordingly, a program is used which either increases the frequency of correction during a period in which a large fluctuation is predicted or reduces the frequency of correction during a period in which the fluctuation has become saturated after a certain amount of time has elapsed.

Furthermore, in the above, the amount of shift in the offset is determined by returning the camera 11 to a single arbitrarily selected pad, which is the pad $P_1$. However, if corrections are made based upon the amount of shift determined from only a single point, an even greater discrepancy may result. Accordingly, it is preferable that corrections are performed using a statistical technique. In the statistical technique, shifts are detected at a plurality of points (in other words, samplings are performed for different bonding points) so as to obtain the average or deviation of the amounts and directions of the shift.

In the above, the offset amount is corrected by detecting the amount of shift of the ball bonded to the pad. However, it goes without saying that it is also possible to use the pressure mark 5 that is created when the capillary 15 is pressed onto a lead L during the bonding process.

As seen from the above, fluctuations in the offset are corrected automatically, and shifts in the bonding position caused by the offset are automatically detected. Accordingly, a series of bonding operations is performed in a fully automatic fashion. In other words, there is no need to align the center of the ball or pressure mark of the capillary with cross-hairs of the camera. Accordingly, the operation time can be greatly reduced, and positioning errors attributable to mistakes by the operator or individual differences among operators can be eliminated. Thus, the positional precision of the bonding coordinates is extremely high.

Normally, the resolution of the television monitor used in a bonding apparatus is six microns/pixel; as a result, positions finer than this value are not judged if positioning is performed manually. However, since the sub-pixel calculation is executable in the present invention, a detection precision of 1/32 pixel is possible; and even if disturbing factors are involved, a precision of 1/4 pixel, that is, 1.5 microns, can be obtained.

As described above in detail, according to the present invention, shifts in the offset distance between the camera and capillary is automatically corrected by detecting the shifts of the bonded ball or capillary's pressure mark after wire bonding has been performed. Furthermore, the precision of correction is high, and fluctuations in the offset that change with the passage of time can also be corrected.

I claim:

1. A wire bonding method which uses a capillary executing wire bonding on a workpiece consisting of a semiconductor chip installed on a lead frame, a camera having a central axis of workpiece detection which is set to have an offset distance from the capillary, and an XY table which moves the capillary and camera together in X and Y directions, said method performing bonding by detecting an amount of shift of said workpiece via said camera, correcting bonding coordinates accordingly, moving said table by an amount that corresponds to said offset distance, and successively moving said capillary to said corrected bonding coordinates in accordance with a predetermined program, and said method being further characterized in that after an offset correction time has passed since bonding has been performed, said XY table is automatically driven so that said central axis of said workpiece detection of said camera is positioned above a bonded ball or capillary pressure mark, a positional shift of said ball or capillary pressure mark is detected, said shift in said offset is corrected accordingly, and said offset correction time is decreased during operational time periods when large fluctuations in said offset distance are predicted and increased during operational time periods when small fluctuations in said offset distance are predicted.

2. A method for correcting a positional shift occurring in an offset distance between a device for taking images of an object on which bonding is performed and a capillary through which a bonding wire is passed for executing bonding on said object comprising the steps of:

moving said device for taking images above said object after passage of an offset correction time since bonding has been performed on said object;

determining any positional discrepancy between an initially intended bonding point and an actual bonded point on said object via said device for taking images;

changing said offset distance by adding said discrepancy determined by said device for taking images to said offset distance;

predicting operational time periods in which large and small offset distance fluctuations are expected; and decreasing said offset correction time during predicted operational time periods in which large offset distance fluctuations are expected and increasing said offset correction time during operational time periods in which small offset distance fluctuations are predicted.

3. A method according to claim 2, further comprising a step of storing said changed offset distance as a corrected offset distance so as to perform succeeding bonding based upon said corrected offset distance.

* * * * *